(12) United States Patent
Okihara

(10) Patent No.: US 6,876,039 B2
(45) Date of Patent: Apr. 5, 2005

(54) VARIABLE THRESHOLD VOLTAGE COMPLEMENTARY MOSFET WITH SOI STRUCTURE

(75) Inventor: Masao Okihara, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/739,200

(22) Filed: Dec. 19, 2003

(65) Prior Publication Data

US 2004/0262647 A1 Dec. 30, 2004

(30) Foreign Application Priority Data

Jun. 27, 2003 (JP) ........................................ 2003-185337

(51) Int. Cl.[7] .............................................. H01L 27/12
(52) U.S. Cl. ...................... 257/350; 257/347; 257/348; 257/349; 257/351; 257/638
(58) Field of Search ................................ 257/347–351, 257/638

(56) References Cited

U.S. PATENT DOCUMENTS 6,537,891 B1 * 3/2003 Dennison et al. ........... 438/406

FOREIGN PATENT DOCUMENTS

JP 2000-124345 4/2000

* cited by examiner

Primary Examiner—Luan Thai
(74) Attorney, Agent, or Firm—Volentine Francos & Whitt, PLLC

(57) ABSTRACT

The dependency of threshold voltage on adjusted bias voltage is varied between N-channel and P-channel MOSFETs. A support substrate, an insulating layer on the support substrate, and island-shaped first and second silicon layers separately formed on the insulating layer; a first MOSFET formed of a fully depleted SOI where a first channel part is formed in a first silicon layer; and a second MOSFET formed of a partially depleted SOI where a second channel part is formed in a second silicon layer, the second MOSFET configures a complementary MOSFET with the first MOSFET, are provided. The threshold voltage of the second MOSFET formed of the partially depleted SOI is hardly varied because of a neutral region in the second channel part, although bias voltage is applied to the support substrate to vary the threshold voltage of the first MOSFET formed of the fully depleted SOI.

6 Claims, 9 Drawing Sheets

Vbs

VARIABLE THRESHOLD VOLTAGE COMPLEMENTARY MOSFET WITH SOI STRUCTURE

BACKGROUND OF THE INVENTION

1. Field of the Invention

The present invention relates to a variable threshold voltage complementary MOSFET with a SOI structure.

2. Description of the Related Art

LSIs of low electric power and high performance are important as key devices for next-generation products of personal and mobile communications. When an LSI is configured with the use of a bulk Si CMOSFET having a typical silicon substrate, the power consumption of the LSI is increased because of the realization of high integration and high speed with the miniaturization of the LSI. Therefore, a low electric power MOSFET having a new device structure that can form an LSI of low electric power and high performance is eagerly waited. In this situation, a fully depleted SOI CMOS (CMOS: Complementary MOSFET) fabricated with the use of a SOI (Silicon on Insulator) substrate having an insulating layer between a support substrate and a silicon layer (device region) is expected as a device of low electric power and high speed. Since a buried oxide film exists under the silicon layer as the insulating layer in the SOI MOSFET, a parasitic capacitance between the source and drain is reduced to allow operations at low electric power and high speed. Furthermore, since the buried oxide film completely separates devices from each other, there are advantages that latch up is not generated and high-density layout is possible. Moreover, in the fully depleted SOI MOSFET, a gradient of drain current can be increased against gate voltage in the subthreshold region of the MOSFET as compared with the bulk Si MOSFET. Therefore, there is an advantage that this difference in the same OFF-current effectively serves to improve performance at low voltage.

As described above, the fully depleted SOI MOSFET has many advantages. In addition to this, it is known that Vth can be varied by applying bias voltage to the support substrate in the relationship of $$|\Delta Vth|=\gamma|\Delta Vbs|$$

because the entire silicon layer in the channel part is depleted. (For example, see Non-patent Document 1 and Non-patent Document 2.) Where Vth is the threshold voltage of the fully depleted SOI MOSFET, Vbs is adjusted bias voltage for adjusting the threshold voltage, and $\gamma$ is a substrate bias coefficient of the SOI substrate.

A device of a variable threshold voltage SOI MOSFET utilizing the properties described above will be described with reference to drawings. FIG. 6 is a cross-sectional view schematically illustrating the structure of the essential part of a variable threshold voltage SOI MOSFET. This variable threshold voltage SOI MOSFET is the fully depleted SOI MOSFET in which a depletion layer is spread throughout a channel part. The variable threshold voltage SOI MOSFET has a silicon layer 29, that is, a SOI layer, on a support substrate 10 through an insulating layer 20. In the silicon layer 29, a source region 32 and a drain region 34 are formed as they sandwich a channel part 36. A source electrode 44 and a drain electrode 46 are disposed so as to contact with the source region 32 and the drain region 34, respectively. A gate electrode 53 is disposed on the channel part 36 as they sandwich a gate insulating film 52. An adjusted bias electrode 63 for applying the adjusted bias voltage Vbs to adjust the threshold voltage of the MOSFET is disposed on the support substrate 10.

FIG. 7 is a diagram for illustrating the operation of an N-channel variable threshold voltage SOI MOSFET where a source region 32 and a drain region 34 are N-type semiconductors. The horizontal axis is gate voltage Vg, and the vertical axis is drain current Id (positive value) by log scale. Vd is power supply voltage. By varying the adjusted bias voltage Vbs, a standby state that the adjusted bias voltage Vbs is 0 V (indicated by Curve I in FIG. 7) is switched to an active state that a positive adjusted bias voltage Vbs is applied (indicated by Curve II in FIG. 7), for example. Moreover, in FIG. 7, Ion1 and Ion2 indicate ON-currents in the standby state and the active state, respectively, and Ioff1 and Ioff2 indicate OFF-currents in the standby state and the active state, respectively. Since the OFF-current is suppressed in the standby state (in a stat of Ioff1<Ioff2), the power consumption is reduced. In the meantime, since the ON-current is increased in the active state (in a state of Ion2>Ion1), high-speed operations are feasible. A variable threshold voltage CMOS utilizing these properties is proposed.

A traditional example of the variable threshold voltage CMOS will be described with reference to FIG. 8. The variable threshold voltage CMOS is configured by combining an N-channel MOSFET with a P-channel MOSFET. More specifically, first and second MOSFETs 12 and 14 are separately formed on an insulating layer 20 of a layered product 25 as the MOSFETs share the layered product 25 formed of a support substrate 10 and the insulating layer 20 disposed on one surface of the support substrate 10. The first MOSFET 12 is the N-channel type, and the second MOSFET 14 is the P-channel type.

In the variable threshold voltage CMOS, the first MOSFET 12 has a first source region 31, a first drain region 33, a first channel part 35 sandwiched between the both regions 31 and 33, and a gate electrode 55 disposed on the channel part 35 as they sandwich a gate insulating film 54 in a silicon layer formed on the insulating layer 20. In the drawing, 45 and 47 are a source electrode and a drain electrode, respectively.

Similarly, the second MOSFET 14 has a second source region 37, a second drain region 39, a second channel part 42 sandwiched between the both regions 37 and 39, and a gate electrode 61 disposed on the channel part 42 as they sandwich a gate insulating film 60 in a silicon layer formed on the insulating layer 20. In the drawing, 49 and 51 are a source electrode and a drain electrode, respectively.

In addition, on the surface opposite to the insulating layer of the support substrate 10 (backside), an adjusted bias electrode 63 to which the adjusted bias voltage Vbs is applied is disposed as shared by the first and second MOSFETs 12 and 14 as similarly described with reference to FIG. 6.

Here, the first channel part 35 and the second channel part 42 are thoroughly depleted, and the first MOSFET 12 and the second MOSFET 14 are the fully depleted SOI MOSFETs.

In this configuration, the adjusted bias voltage Vbs is applied to the adjusted bias electrode 63 disposed on the support substrate 10, which causes the threshold voltages of the first MOSFET 12 and the second MOSFET 14 to be varied.

Non-patent Document 1

Nagumo et al. Sikii-den'atu kahen-gata kanzen kubou-gata SOI MOSFET no sikii-den'atu tyousei han'i, Technical Report of IEICE. SDM 2002-138, ICD 2002-49 (2002-08) P. 20

Non-patent Document 2

T. Hiramoto et al. Optimum Device Parameters and Scalability of Variable Threshold Voltage Complementary MOS (VTCMOS), Jpn. J. Appl. Phys. Vol. 40 (2001) pp. 2854 to 2855

However, the P-channel variable threshold voltage SOI MOSFET operates in opposite ways to the response of the threshold voltage of the N-channel variable threshold voltage SOI MOSFET.

The manner that the P-channel variable threshold voltage SOI MOSFET operates in opposite ways will be described with reference to FIG. 9. The horizontal axis indicates gate voltage Vg, and the vertical axis indicates drain current Id by log scale. In the P-channel MOSFET, the drain current Id is a negative value, thus indicated by the absolute value. Vd is power supply voltage. By varying the adjusted bias voltage Vbs, a standby state that the adjusted bias voltage Vbs is 0 V (indicated by Curve IV in FIG. 9) is switched to an active state that the positive adjusted bias voltage Vbs is applied (indicated by Curve III in FIG. 9), for example. Furthermore, in FIG. 9, Ion3 and Ion4 indicate ON-currents in the active state and the standby state, respectively, and Ioff3 and Ioff4 indicate OFF-currents in the active state and the standby state, respectively. The OFF-current is suppressed in the active state (the state of Ioff3<Ioff4), whereas the ON-current is increased in the standby state (the state of Ion4>Ion3).

On this account, in the case where the adjusted bias voltage Vbs is applied to the support substrate 10 for adjusting the threshold voltage in the variable threshold voltage CMOS having the structure shown in FIG. 8, the threshold voltage is reduced in the N-channel MOSFET 12, for example, and then the threshold voltage is increased in the P-channel MOSFET 14. Therefore, when the adjusted bias voltage Vbs is simply applied to the support substrate 10, the ON-current of the N-channel MOSFET 12 is increased, and then the ON-current of the P-channel MOSFET 14 is reduced.

When the variable threshold voltage CMOS combining the P-channel MOSFET with the N-channel MOSFET in which the MOSFETS operate in opposite ways is incorporated in a current mirror type circuit, for example, it is unlikely to expect improved properties of the current mirror circuit as desired.

For the scheme to solve this, a scheme can be considered that the adjusted bias voltage Vbs is separately applied to each region. However, when an electrode for applying the adjusted bias voltage Vbs to each region is separately formed, a disadvantage is generated such as complicated fabrication processes.

Then, as a result of various investigations done by the inventor of this application, a conclusion is obtained. A CMOS structure is formed in which a so-called partially depleted MOSFET where a depletion layer is not spread to the under area of a channel part and a fully depleted MOSFET are separately formed on a shared layered product formed of a support substrate and an insulating layer formed thereon. Therefore, the threshold voltage of the fully depleted MOSFET can be varied when the common adjusted bias voltage Vbs is applied from the support substrate side, whereas the threshold voltage of the partially depleted MOSFET can be kept at fixed voltage, not allowed to change the set threshold voltage.

SUMMARY OF THE INVENTION

In view of the circumstances, an object of the invention is to provide a variable threshold voltage complementary MOSFET (VTCMOS) with a SOI structure that allows the dependency of the threshold voltage on the adjusted bias voltage Vbs to be varied between the N-channel and P-channel MOSFETs.

In order to achieve the object, a variable threshold voltage complementary MOSFET according to the invention includes:

a SOI substrate main body having a support substrate, an insulating layer disposed on the support substrate, and island-shaped first and second silicon layers separately formed on the insulating layer;

a first MOSFET formed of a fully depleted SOI where a first channel part is formed in the first silicon layer;

a second MOSFET formed of a partially depleted SOI where a second channel part is formed in the second silicon layer, the second MOSFET configuring a complementary MOSFET with the first MOSFET; and an adjusted bias electrode disposed on the support substrate for applying an adjusted bias voltage to adjust threshold voltage of the complementary MOSFET to the SOI substrate main body.

In this variable threshold voltage complementary MOSFET, the first MOSFET formed of the fully depleted SOI varies its threshold voltage when the adjusted bias voltage is applied to the support substrate. However, the second MOSFET formed of the partially depleted SOI has a region where a depletion layer is not formed, the region is a neutral region to suppress adjusting the threshold voltage of the second MOSFET by the adjusted bias voltage (it is also called an undepleted region). The neutral region exists in the area of the second channel part in the second silicon layer. The existence of the neutral region keeps the threshold voltage of the second MOSFET substantially constant even though the adjusted bias voltage is applied to the support substrate. As described above, according to the variable threshold voltage complementary MOSFET of the invention, properties required for current mirror circuits can be obtained.

In the implementation of the invention, a suppressed voltage electrode for applying suppressed voltage to suppress the threshold voltage to the neutral region is preferably provided to contact with the neutral region.

With this configuration, the suppressed voltage is applied to the neutral region of the second MOSFET of partially depleted type, which prevents the influence of the adjusted bias voltage applied to the support substrate and allows the threshold voltage not to be varied more surely.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

Hereinafter, embodiments of the invention will be described with reference to the drawings. However, the configurations, and the size and arrangement of components are expressed schematically to the extent that the invention can be understood. In addition, the preferred exemplary configurations of the invention will be described below, but the composition (material) and numeric conditions of the components are simply preferred examples. Therefore, the invention is not defined to the embodiments below, which can be modified or altered variously without deviating from the scope of the invention.

Description of a First Embodiment

Figure 1:
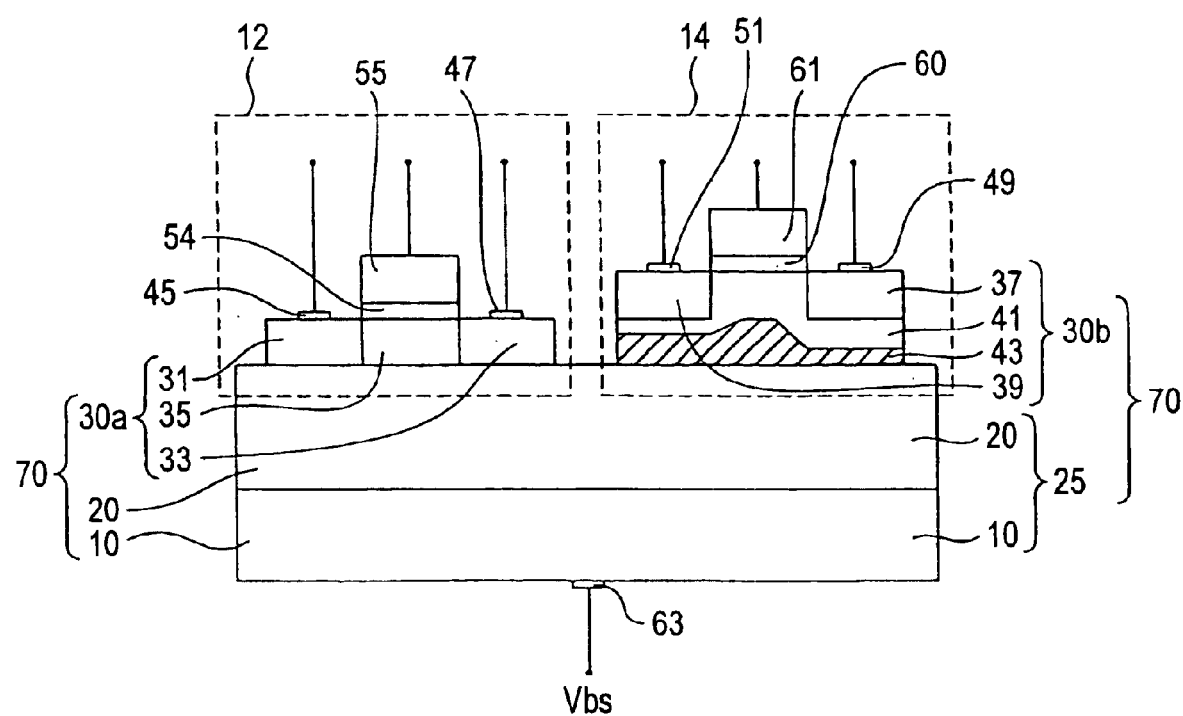
FIG. 1 is a schematic diagram illustrating the exemplary configuration of a variable threshold voltage CMOS with an SOI structure of a first embodiment according to the invention.

The schematic configuration of a variable threshold voltage CMOS with a SOI structure of a first embodiment according to the invention will be described with reference to FIG. 1. FIG. 1 is a diagram schematically illustrating the cross section of the essential part of the variable threshold voltage CMOS according to the invention. In addition, hatching showing the cross section is partly omitted.

The variable threshold voltage CMOS with the SOI structure has a SOI substrate main body 70, a first MOSFET 12, a second MOSFET 14, and an adjusted bias electrode 63.

The SOI substrate main body 70 is configured to include a support substrate 10, an insulating layer 20 disposed on the support substrate 10, an island-shaped first silicon layer 30a and an island-shaped second silicon layer 30b separately disposed on the insulating layer 20. The insulating layer 20 is implemented by a buried oxide film.

Figure 8:
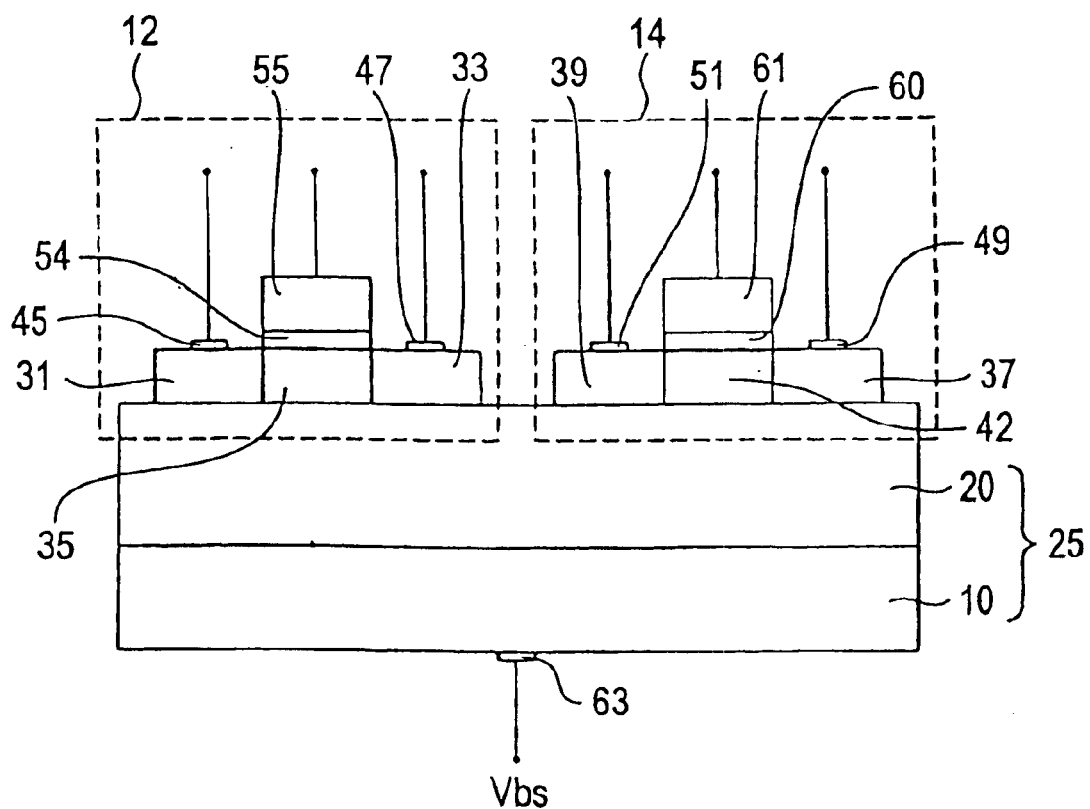
FIG. 8 is a schematic diagram illustrating the traditional structure of the variable threshold voltage CMOS.
Figure 9:
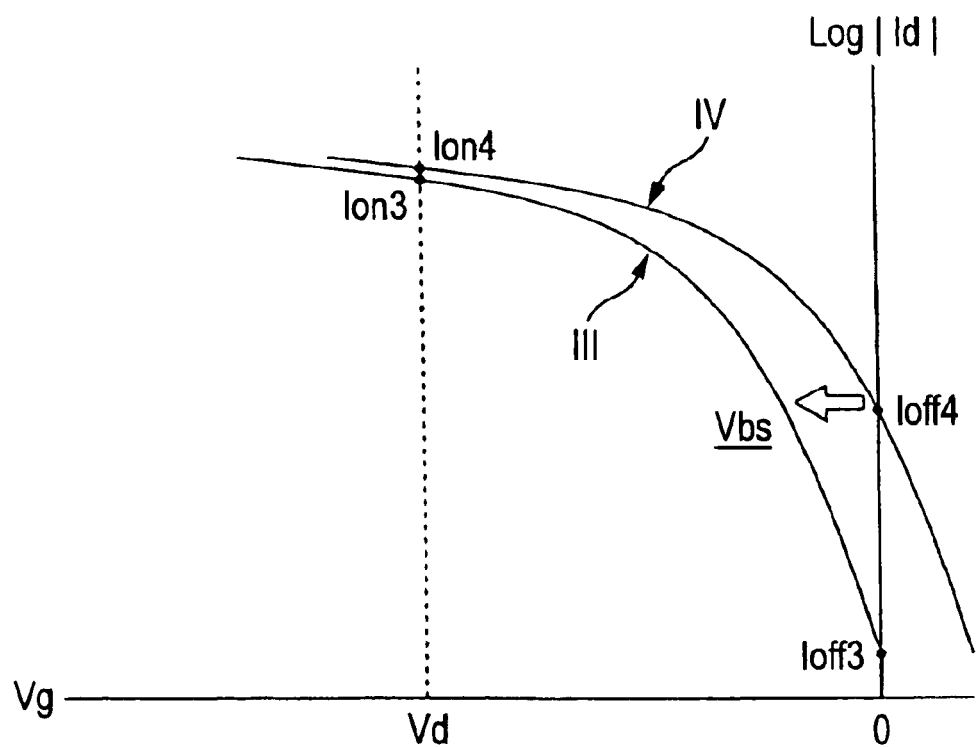
FIG. 9 is a schematic diagram illustrating the operation of the P-channel MOSFET of the variable threshold voltage.

The first MOSFET 12 has the same configuration as that of the first MOSFET of the variable threshold voltage CMOS in the traditional example described with reference to FIG. 8. Also in this embodiment, the first MOSFET 12 is configured to include a first source region 31 and a first drain region 33 formed on the first silicon layer 30a as they sandwich a first channel part 35. Furthermore, a first gate electrode 55 is disposed on the first channel part 35 of the first MOSFET 12 as they sandwich a first gate insulating film 54. The first gate insulating film 54 is implemented by an oxide film. A first source electrode 45 and a first drain electrode 47 are disposed so as to contact with the first source region 31 and the first drain region 33, respectively. Here, the first MOSFET 12 is the fully depleted MOSFET where the entire first channel part is formed into the depleted region.

The second MOSFET 14 is configured to include a second source region 37 and a second drain region 39 formed on the second silicon layer 30b as they sandwich the second channel part. Moreover, a second gate electrode 61 is disposed on a second channel part of the second MOSFET 14 as they sandwich a second gate insulating film 60. The second gate insulating film 60 is implemented by an oxide film. A source electrode 49 and a second drain electrode 51 are formed so as to contact with the second source region 37 and the second drain region 39, respectively. Here, the second MOSFET 14 is the partially depleted MOSFET in which a part of the second channel part is formed into a depleted region 41 and the lower area of the second channel part is formed into a silicon layer region where the depletion layer is not spread, that is, a neutral region 43. In addition, the neutral region 43 is the region in the area of the second silicon layer 30b where the depletion layer is not formed, which is sometimes formed over the areas other than the lower area of the second channel part.

For a fabrication method of the first MOSFET 12 formed of the fully depleted SOI and the second MOSFET 14 formed of the partially depleted SOI, any fabrication methods are acceptable when the methods are the fabrication method that the difference of film thickness is generated between the first and second silicon layers 30a and 30b. For example, etching masks are disposed over the areas to form the first and second silicon layers 30a and 30b on the silicon layer of the SOI substrate including a silicon layer having a uniform thickness. In this case, the thickness of the etching mask (referred to as a second mask) over the area to form the second silicon layer is formed thicker than the thickness of the etching mask (referred to as a first mask) over the area to form the first silicon layer. The difference of film thickness between the first and second masks is set beforehand so that the second mask is still left when the first mask is removed by etching and the surface of the first silicon layer is removed by etching to some extent when the second mask is fully removed for generating the difference of film thickness between the first and second silicon layers as designed. The masks are disposed in this manner to etch the first and second silicon layers simultaneously, thus allowing the first silicon layer 30a and the second silicon layer 30b having different film thicknesses to be formed in the same process step. When the thickness of the first silicon layer 30a is formed 50 nm or below and the thickness of the second silicon layer 30b is formed about 100 nm, the first MOSFET 12 is formed as the fully depleted type and the second MOSFET 14 is formed as the partially depleted type. In addition, after the first and second silicon layers 30a and 30b are formed, it is fine that well-known typical techniques are used to form the source region, the drain region, the gate insulating film, the gate electrode, the source electrode, the drain electrode, and the adjusted bias electrode.

The adjusted bias electrode 63 is an electrode for applying the adjusted bias voltage Vbs to adjust the threshold voltage of the fully depleted MOSFET to the support substrate 10. The threshold voltage of the first MOSFET 12 formed of the fully depleted SOI can be set to have values as desired by applying the adjusted bias voltage Vbs to the support substrate 10 through the adjusted bias electrode 63. At this time, the threshold voltage of the second MOSFET 14 hardly receives the influence of the adjusted bias voltage Vbs because of the neutral region 43 formed in the lower area of the channel part of the second MOSFET formed of the partially depleted SOI.

The variable threshold voltage CMOS with the SOI structure is formed in which the first MOSFET 12 formed of the fully depleted SOI is the N-channel MOSFET and the second MOSFET 14 formed of the partially depleted SOI is the P-channel MOSFET, for example. At this time, it is acceptable that the first MOSFET 12 formed of the fully depleted SOI is the P-channel MOSFET and the second MOSFET 14 formed of the partially depleted SOI is the N-channel.

Advantage of the First Embodiment

By applying the adjusted bias voltage Vbs to the adjusted bias electrode 63 formed on the support substrate 10, the threshold voltage of the partially depleted P-channel MOSFET 14 is hardly affected, the threshold voltage of the fully depleted N-channel MOSFET 12 can be varied, and desired properties can be obtained.

Description of a Second Embodiment

Figure 2:
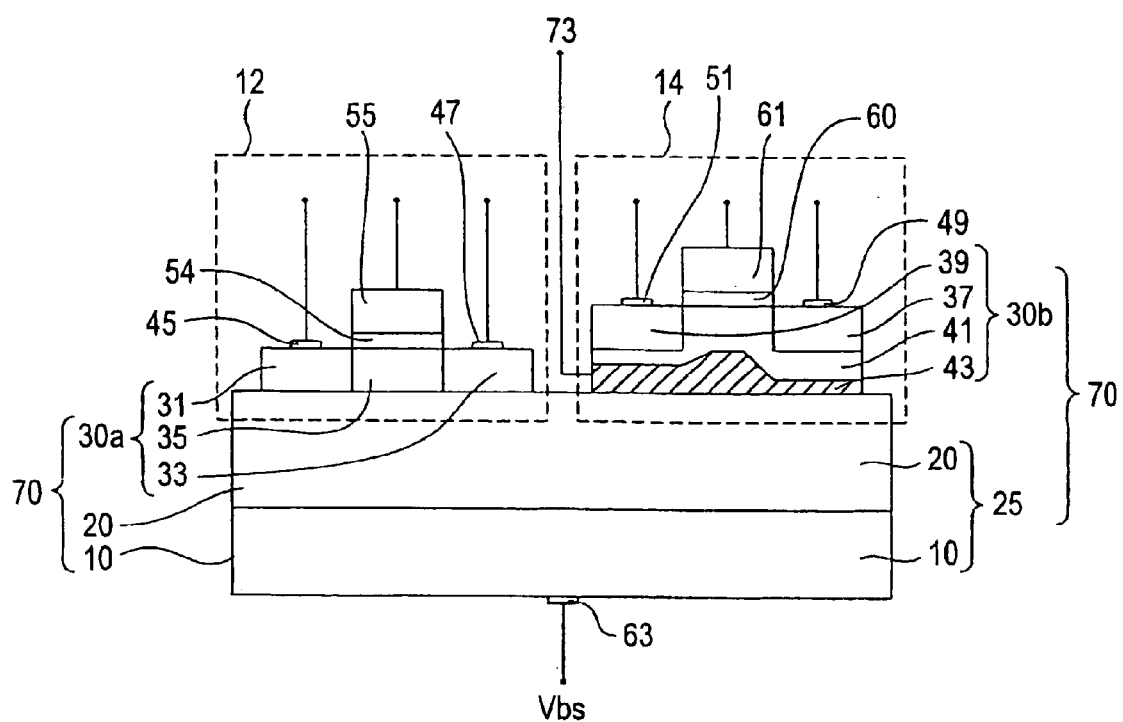
FIG. 2 is a cross-sectional view along line II–II' shown in FIG. 3 illustrating the exemplary configuration of a variable threshold voltage CMOS with a SOI structure of a second embodiment according to the invention.

The schematic configuration of a variable threshold voltage CMOS with a SOI structure of a second embodiment according to the invention will be described with reference to FIG. 2. The description of the same reference numerals and signs as those in FIG. 1 is omitted.

This configuration is almost the same as the exemplary configuration of the first embodiment. For example, a first MOSFET 12 formed of the fully depleted SOI is the N-channel type, and a second MOSFET 14 formed of the partially depleted SOI is the P-channel type. The P-channel second MOSFET 14 is the partially depleted type in which the threshold voltage of the partially depleted type is hardly varied because a neutral region 43 exists in the area of its channel part even though the adjusted bias voltage Vbs is changed.

In order to substantially eliminate the influence of the adjusted bias voltage Vbs upon the second MOSFET 14, the variable threshold voltage CMOS with the SOI structure of the second embodiment has a suppressed voltage electrode 73 for applying a suppressed voltage Vbb to the neutral region 43 in a second silicon layer 30b in addition to the configuration of the first embodiment. The fixed suppressed voltage Vbb applied to the neutral region 43 through the suppressed voltage electrode 73 allows the potential of the neutral region 43 to be kept constant. On this account, the adjusted bias voltage Vbs applied to a support substrate 10 does not affect the second MOSFET 14. It can be possible to vary the threshold voltage of the first MOSFET 12 formed of the fully depleted SOI independent of the second MOSFET 14 formed of the partially depleted SOI.

As similar to the first embodiment, it is acceptable that the first MOSFET 12 formed of the fully depleted SOI is the P-channel MOSFET and the second MOSFET 14 formed of the partially depleted SOI is N-channel MOSFET.

Example of the Second Embodiment

Figure 3:
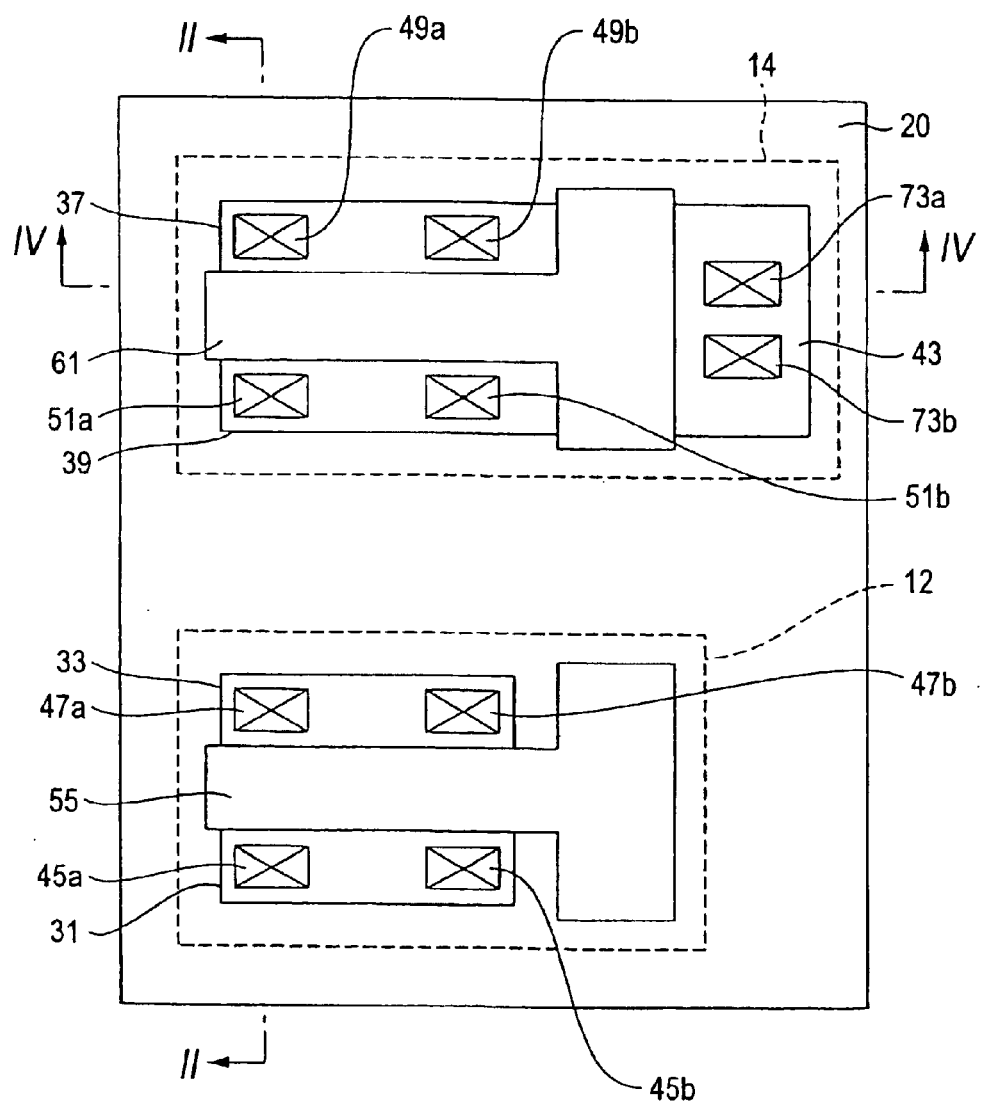
FIG. 3 is a schematic diagram illustrating the exemplary configuration of the variable threshold voltage CMOS with the SOI structure of the second embodiment according to the invention.
Figure 4:
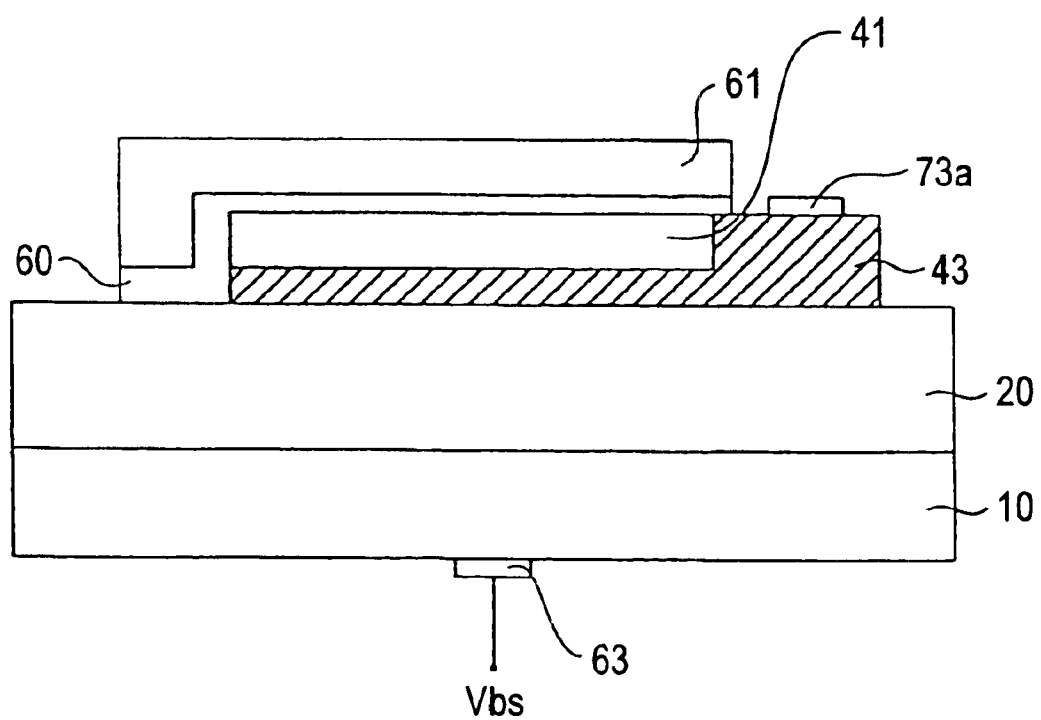
FIG. 4 is a cross-sectional view along line IV–IV' shown in FIG. 3 illustrating the exemplary configuration of the variable threshold voltage CMOS with the SOI structure of the second embodiment according to the invention.

The embodiment will be described with reference to FIGS. 3 and 4 along with FIG. 2. FIG. 3 is a schematic plan view where the variable threshold voltage CMOS with the SOI structure is seen from above. FIGS. 2 and 4 are diagrams schematically illustrating the cross sections along line II–II' and line IV–IV', respectively.

The first MOSFET 12 has a first T-gate electrode 55. Furthermore, the first MOSFET 12 has two first source electrodes 45a and 45b so as to contact with a first source region 31, and has first drain electrodes 47a and 47b so as to contact with a first drain region 33. The area between the source region 31 and the drain region 33 covered with the T-gate electrode 55 is a first channel part 35, and a depletion layer is formed throughout the first channel part 35 to be a depleted region.

The second MOSFET 14 also has a second T-gate electrode 61 as similar to the first MOSFET 12. Furthermore, it has two second source electrodes 49a and 49b so as to contact with a second source region 37, and has second drain electrodes 51a and 51b so as to contact with a second drain region 39. Moreover, suppressed voltage electrodes 73a and 73b are disposed on the neutral region 43 of the second MOSFET 14. The area between the source region 37 and the drain region 39 covered with the T-gate electrode 61 is a channel part, and a depletion layer is formed in the upper area of the channel part (the area close to the gate electrode) to be a depleted region 41 (see FIG. 4). Additionally, in the exemplary configuration shown in FIGS. 3 and 4, the neutral region 43 exists over the other areas of the second silicon layer in addition to the lower area of the second channel part.

Figure 5:
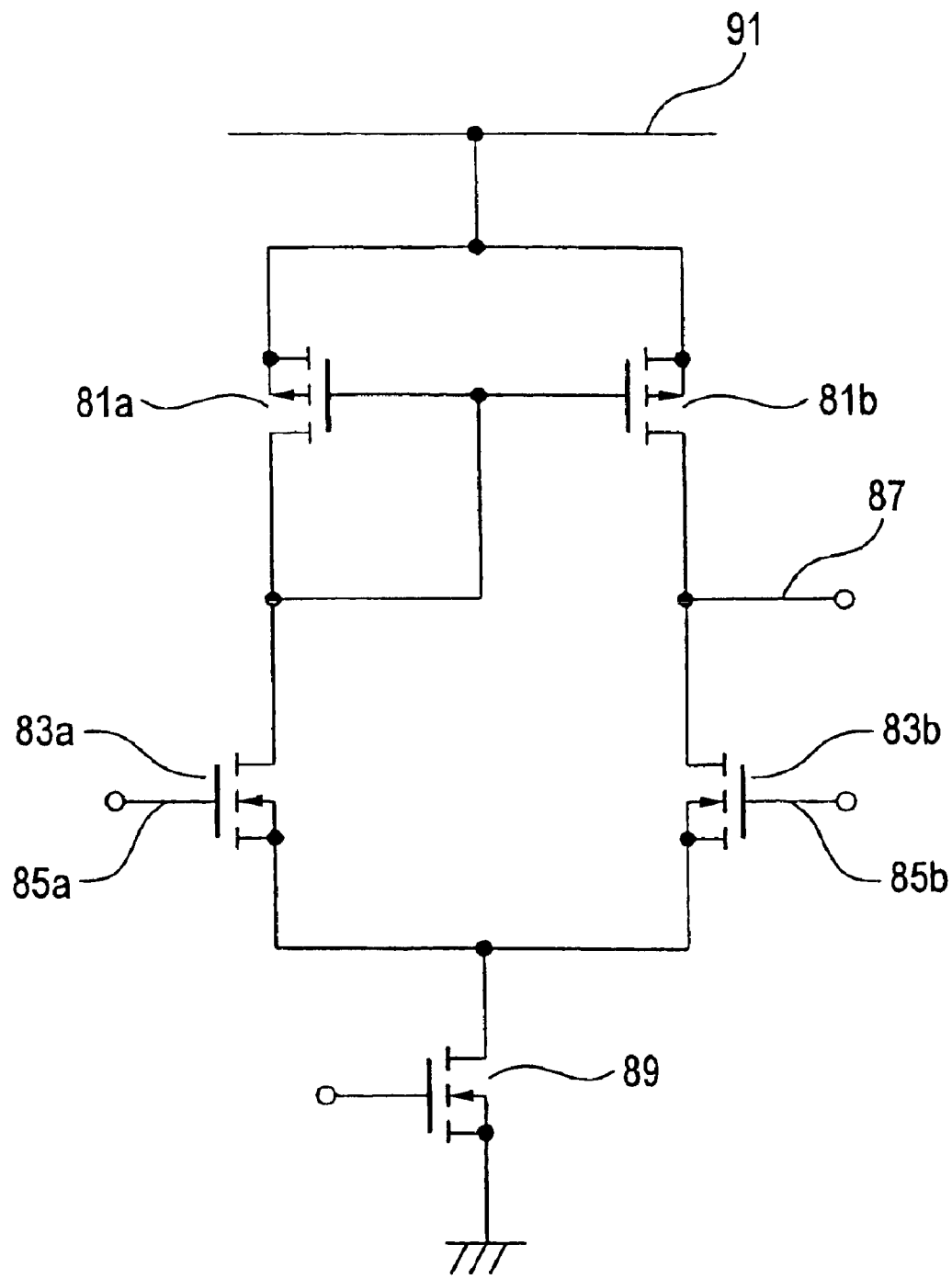
FIG. 5 is a circuit diagram illustrating a differential amplifier circuit where a current mirror circuit is used as a load.
Figure 6:
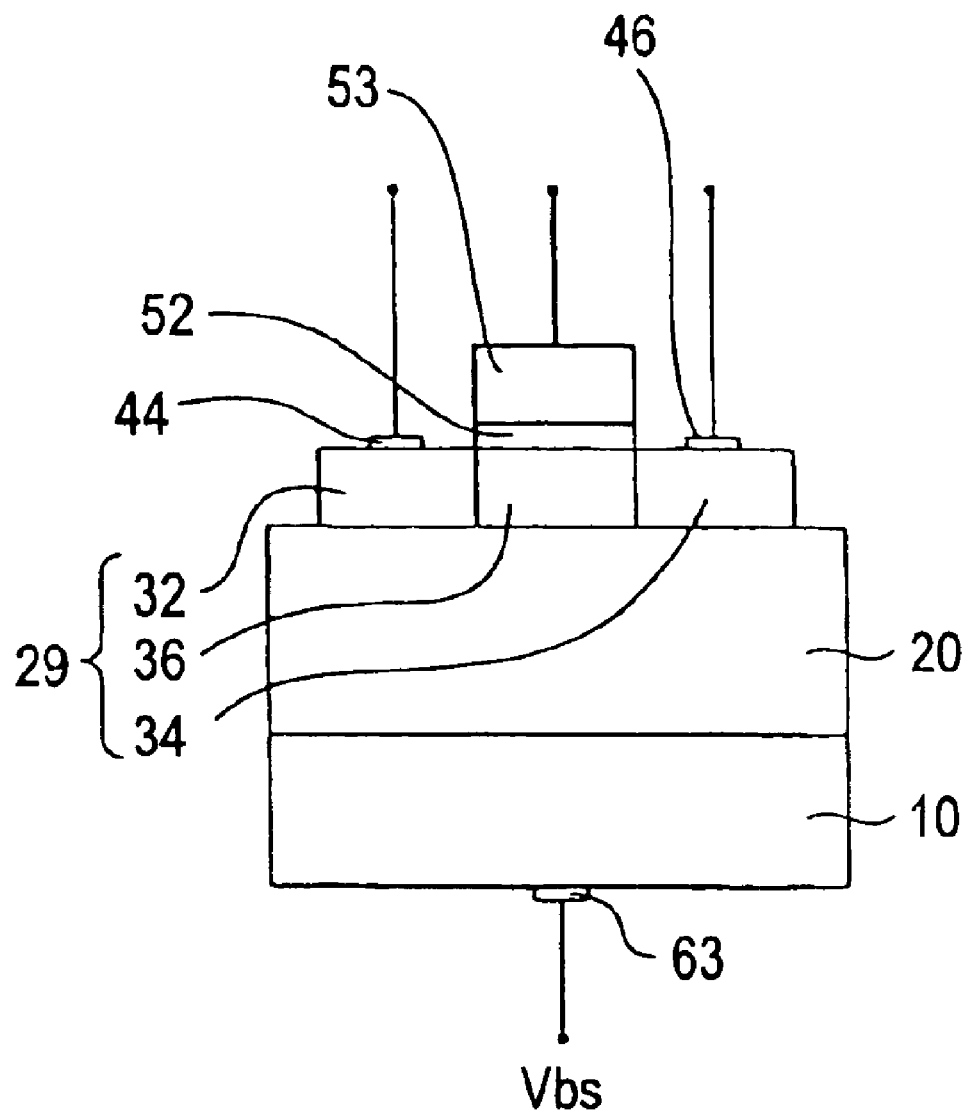
FIG. 6 is a schematic diagram illustrating the structure of the variable threshold voltage SOI MOSFET.
Figure 7:
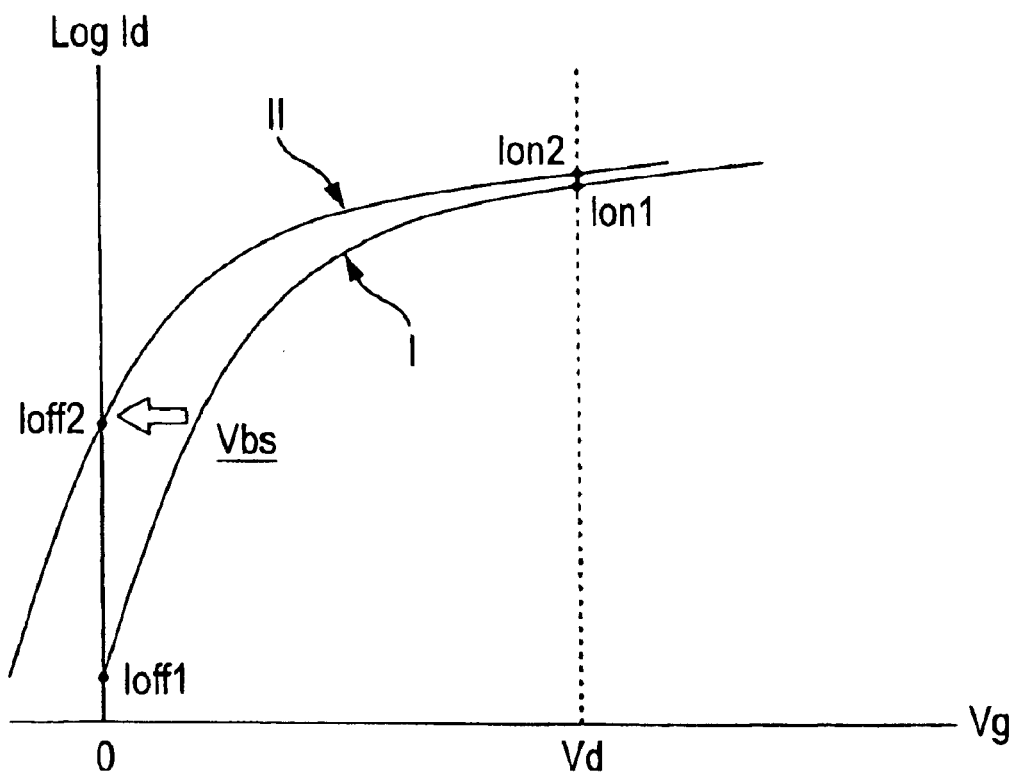
FIG. 7 is a schematic diagram illustrating the operation of the N-channel MOSFET of the variable threshold voltage.

FIG. 5 is a diagram illustrating the exemplary configuration of a differential amplifier circuit with a current mirror circuit using the variable threshold voltage CMOS. The circuit is configured to include two CMOSs having two P-channel MOSFETs 81a and 81b and two N-channel MOSFETs 83a and 83b. The P-channel MOSFETs 81a and 81b are the partially depleted MOSFETs, and the N-channel MOSFETs 83a and 83b are the fully depleted MOSFETs.

Sources of the P-channel MOSFETs 81a and 81b are connected to a power source 91. Sources of the N-channel MOSFETs 83a and 83b are connected to a drain of an N-channel MOSFET 89 to which clocks are inputted, and a source of the N-channel MOSFET 89 is earthed. A drain of the P-channel MOSFET 81a is connected to a drain of the N-channel MOSFET 83a. Furthermore, a drain of the P-channel MOSFET 81b is connected to a drain of the N-channel MOSFET 83b as well. The drain of the P-channel MOSFET 81a and the drain of the N-channel MOSFET 83a are connected to gates of the P-channel MOSFETs 81a and 81b. Signals are inputted to input gate terminals 85a and 85b of the N-channel MOSFETs 83a and 83b, but the input to the input terminal 85a of the N-channel MOSFET 83a and the input of the input terminal 85b of the N-channel MOSFET 83b are opposite phases each other. Moreover, the output is taken out of an output terminal 87 connected to the drains of the P-channel MOSFET 81b and the N-channel MOSFET 83b.

According to the circuit configuration, the threshold voltage of each of the MOSFETs can be adjusted separately, and thus the differential amplifier circuit can be operated at low power consumption and high speed. In addition, the threshold voltages are set separately, thus easily obtaining amplification factors of the differential amplifier circuit as designed.

Advantage of the Second Embodiment

The suppressed voltage Vbb is applied from outside to the neutral region 43 of the second MOSFET 14 formed of the partially depleted SOI. Therefore, the adjusted bias voltage Vbs applied to the support substrate 10 does not affect the second MOSFET 14 formed of the partially depleted SOI at all. Moreover, the adjusted bias voltage Vbs and the suppressed voltage Vbb are completely independent of each other. Thus, the adjusted bias voltage Vbs and the suppressed voltage Vbb are properly applied to the adjusted bias electrode and the suppressed voltage electrode to allow the fully depleted MOSFET and the partially depleted MOSFET to operate as threshold voltage variable MOSFETs simultaneously.

As apparent from the description, according to the variable threshold voltage complementary MOSFET with the SOI structure of the invention, the variable threshold voltage CMOS can be provided that allows the dependency of the threshold voltage on the adjusted bias voltage Vbs to be varied between the fully depleted MOSFET and the partially depleted MOSFET.

what is claimed is:

1. A variable threshold voltage complementary MOSFET with an SOI structure comprising:

an SOI substrate main body having a support substrate, an insulating layer disposed on the support substrate, and island-shaped first and second silicon layers separately formed on the insulating layer;

a first MOSFET formed of a fully depleted SOI where a first channel part is formed in the first silicon layer;

a second MOSFET formed of a partially depleted SOI where a second channel part is formed in the second silicon layer, the second MOSFET configured as a complementary MOSFET with the first MOSFET; and an adjusted bias electrode disposed on the support substrate for applying to the SOI substrate main body an adjusted bias voltage that adjusts threshold voltage of the complementary MOSFET, wherein the first MOSFET has a first source region and a first drain region formed in the first silicon layer that sandwich the first channel part, and a first gate electrode disposed on the first channel part with a first gate insulating film sandwiched therebetween, and the second MOSFET has a second source region and a second drain region in the second silicon layer that sandwich the second channel part, a second gate electrode formed on the second channel part with a second gate insulating film sandwiched therebetween, a neutral region in the second silicon layer where a depletion layer is not formed so that adjusting of the threshold voltage of the second MOSFET responsive to the adjusted bias voltage is suppressed, and a suppressed voltage electrode disposed so as to contact with the neutral region for applying suppressed voltage to the neutral region to suppress the threshold voltage.

2. The variable threshold voltage complementary MOSFET with the SOI structure according to claim 1, wherein the first MOSFET is an N-channel MOSFET and the second MOSFET is a P-channel MOSFET.

3. The variable threshold voltage complementary MOSFET with the SOI structure according to claim 1, wherein the first MOSFET is a P-channel MOSFET and the second MOSFET is an N-channel MOSFET.

4. A variable threshold voltage complementary MOSFET with an SOI structure comprising:

an SOI substrate main body having a support substrate, an insulating layer disposed on the support substrate, and island-shaped first and second silicon layers separately formed on the insulating layer;

a first MOSFET formed of a fully depleted SOI where a first channel part is formed in the first silicon layer;

a second MOSFET formed of a partially depleted SOI where a second channel part is formed in the second silicon layer, the second MOSFET configured as a complementary MOSFET with the first MOSFET; and an adjusted bias electrode disposed on the support substrate for applying an adjusted bias voltage, the adjusted bias voltage selectively adjusts the first MOSFET formed of the fully depleted SOI independently from the second MOSFET formed of the partially depleted SOI.

5. The variable threshold voltage complementary MOSFET with the SOI structure according to claim 4, wherein the first MOSFET is an N-channel MOSFET and the second MOSFET is a P-channel MOSFET.

6. The variable threshold voltage complementary MOSFET with the SOI structure according to claim 4, wherein the first MOSFET is a P-channel MOSFET and the second MOSFET is an N-channel MOSFET.

* * * * *